(12) United States Patent
Chossat et al.

(10) Patent No.: US 10,455,213 B2
(45) Date of Patent: Oct. 22, 2019

(54) DEVICE HAVING A 2D IMAGE SENSOR AND DEPTH SENSOR

(71) Applicant: STMicroelectronics (Grenoble 2) SAS, Grenoble (FR)

(72) Inventors: Jerome Chossat, Voiron (FR); Olivier Le-Briz, Saint-Gervais (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 226 days.

(21) Appl. No.: 15/467,421

(22) Filed: Mar. 23, 2017

(65) Prior Publication Data
US 2018/0084238 A1 Mar. 22, 2018

(30) Foreign Application Priority Data

Sep. 21, 2016 (FR) .................................. 16 58884

(51) Int. Cl.
*H04N 13/207* (2018.01)
*H04N 13/254* (2018.01)
*H01L 27/146* (2006.01)
*H04N 5/369* (2011.01)
*H04N 13/271* (2018.01)

(52) U.S. Cl.
CPC ....... *H04N 13/207* (2018.05); *H01L 27/1469* (2013.01); *H01L 27/14607* (2013.01); *H01L 27/14636* (2013.01); *H01L 27/14645* (2013.01); *H01L 27/14649* (2013.01); *H04N 5/3696* (2013.01); *H04N 13/254* (2018.05); *H04N 13/271* (2018.05)

(58) Field of Classification Search
CPC ...... H04N 5/2226; H04N 5/332; H04N 5/335; H04N 5/33; H01L 27/14647; H01L 27/14652
See application file for complete search history.

(56) References Cited

U.S. PATENT DOCUMENTS

2010/0020209 A1* 1/2010 Kim ....................... H04N 3/155
348/294
2010/0051836 A1* 3/2010 Kim ....................... G01S 7/483
250/574

(Continued)

FOREIGN PATENT DOCUMENTS

FR 3026227 A1 3/2016

OTHER PUBLICATIONS

R. Lange and P. Seitz, "Solid-state Tof range camera", IEEE Journal on Quantum Electronics, vol. 37, No. 3, Mar. 2001 (8 pages).

(Continued)

*Primary Examiner* — Clifford Hilaire
(74) *Attorney, Agent, or Firm* — Crowe & Dunlevy

(57) ABSTRACT

A three dimensional (3D) device is formed from a first level and a second level that are attached together. The first level includes a backside illuminated two dimensional (2D) image sensor including an array of first pixels sensitive to visible light. The second level includes a frontside illuminated depth sensor including an array of second pixels sensitive to near infrared light. The first and second levels are attached in a manner such that radiation, in particular the near infrared light, received at the backside of the first level passes through the first level to reach the depth sensor in the second level.

5 Claims, 3 Drawing Sheets

(56) References Cited

U.S. PATENT DOCUMENTS

| | | | |
|---|---|---|---|
| 2011/0217812 A1* | 9/2011 | Hedler | H01L 21/56 |
| | | | 438/108 |
| 2012/0154596 A1* | 6/2012 | Wajs | H04N 5/33 |
| | | | 348/164 |
| 2012/0189293 A1* | 7/2012 | Cao | G03B 9/02 |
| | | | 396/333 |
| 2013/0278726 A1* | 10/2013 | Muhammad | H04N 9/045 |
| | | | 348/46 |
| 2014/0015932 A1 | 1/2014 | Kim et al. | |
| 2015/0054962 A1 | 2/2015 | Borthakur et al. | |
| 2016/0104743 A1* | 4/2016 | Tchelnokov | H01L 25/167 |
| | | | 257/91 |
| 2016/0181226 A1* | 6/2016 | Wan | H01L 27/14629 |
| | | | 348/164 |
| 2016/0284743 A1 | 9/2016 | Mellot et al. | |

OTHER PUBLICATIONS

INPI Search Report and Written Opinion for FR 1658884 dated May 12, 2017 (7 pages).

* cited by examiner

DEVICE HAVING A 2D IMAGE SENSOR AND DEPTH SENSOR

PRIORITY CLAIM

This application claims the priority benefit of French Application for Patent No. 1658884, filed on Sep. 21, 2016, the disclosure of which is hereby incorporated by reference in its entirety.

TECHNICAL FIELD

The present disclosure relates to the field of imaging devices, and in particular to a device comprising both a two dimensional (2D) image sensor and a depth sensor, and to a method of forming the same.

BACKGROUND

A two-dimensional (2D) silicon-based image sensor is capable of capturing an image from light having wavelengths in the visible range. For certain applications, such as for gesture recognition, liveness detection and/or autofocusing, it would be desirable to be able to additionally capture depth information from the image scene.

One solution for capturing both a 2D image and depth information would be to provide a 2D image sensor and a separate depth sensor for capturing the depth information. However, such a solution has drawbacks in terms of cost, bulkiness, and also due to the difficulty in accurately aligning the depth information with the captured image when the fields of view of the sensors are not exactly identical.

A further solution could be to integrate the pixels of the depth sensor for capturing the depth information within the 2D image sensor. However, the technology used for implementing 2D image pixels and depth pixels is generally not the same, and thus the integration of these two types of pixels in a single array would lead to a complex and costly process. Furthermore, there are likely to be compatibility issues with topologies of the connections of these two types of sensors.

There is thus a need in the art for a compact solution providing a 2D image sensor and a depth sensor in a single device.

SUMMARY

It is an aim of embodiments of the present description to at least partially address one or more needs in the prior art.

According to one aspect, there is provided a three dimensional (3D) device comprising: a first level having a two dimensional (2D) image sensor comprising an array of first pixels; and a second level having a depth sensor comprising a plurality of second pixels sensitive to light in the near infrared wavelength range, the depth sensor being lit through the first level.

According to one embodiment, the first level is superposed over the second level such that the 2D image sensor at least partially overlaps the depth sensor.

According to one embodiment, the first level comprises: an array of photodiodes arranged to be exposed to an image scene; and a first electrical interconnection layer; and the second level comprises: a second electrical interconnection layer bonded to the first electrical interconnection layer; and a further layer comprising the second pixels.

According to one embodiment, the first and second electrical interconnection layers have a reduced density or absence of interconnections in zones aligned with each depth pixel in the direction of illumination of the device.

According to one embodiment, the array of pixels of the 2D image sensor is a continuous array of pixels sensitive to light in the visible wavelength range.

According to one embodiment, the array of pixels of the 2D image sensor comprises openings in which there are no first pixels present, the openings being aligned with each of the second pixels in the direction of illumination of the device.

According to one embodiment, the first and second levels are bonded together by molecular bonding.

According to one embodiment, the first and second levels each comprise a silicon substrate and the silicon depth of each second pixel is in the range 5 to 20 µm.

According to one embodiment, the silicon depth of each second pixel is in the range 10 to 20 µm.

According to one embodiment, each second pixel comprises one of: a SPAD (single-photon avalanche diode); and a photodiode configured to sample received light during three or more phases of a received light signal.

According to a further aspect, there is provided an image capturing device comprising: the above 3D device; and a processing device coupled to the 3D device and adapted to perform image processing on pixel information captured by the 2D image sensor and the depth sensor in order to generate 2D images and depth maps.

According to one embodiment, the processing device is configured to generate 2D images based on pixel information captured by the 2D image sensor and light intensity information captured by the second pixels of the depth sensor.

According to one embodiment, the processing device is configured to generate the depth maps based on depth information determined based on signals provided by the second pixels of the depth sensor and on 2D pixel information captured by the 2D image sensor.

According to one embodiment, the processing device is configured to adjust the sensitivity of the depth sensor based on 2D pixel information captured by the 2D image sensor.

According to a further aspect, there is provided a method of fabricating a 3D device comprising: fabricating a first level of the 3D device in a first wafer, the first level having a 2D image sensor comprising an array of first pixels; fabricating a second level of the 3D device in a second wafer, the second level having a depth sensor comprising a plurality of second pixels sensitive to light in the near infrared wavelength range; and assembling the 3D device by attaching together the first and second levels, the depth sensor being lit through the first level.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between circuit elements, whereas the term "coupled" is used to designate a connection that may be direct, or may be via one or more intermediate elements such as resistors, capacitors or transistors. The term "around" is used to designate a tolerance of plus or minus 10 percent of the value in question.

Terms that depend on the orientation of a device, such as "vertical", "top", "bottom", etc., should be assumed to correspond to the case in which the device is orientated as illustrated in the figures.

Figure 1A:
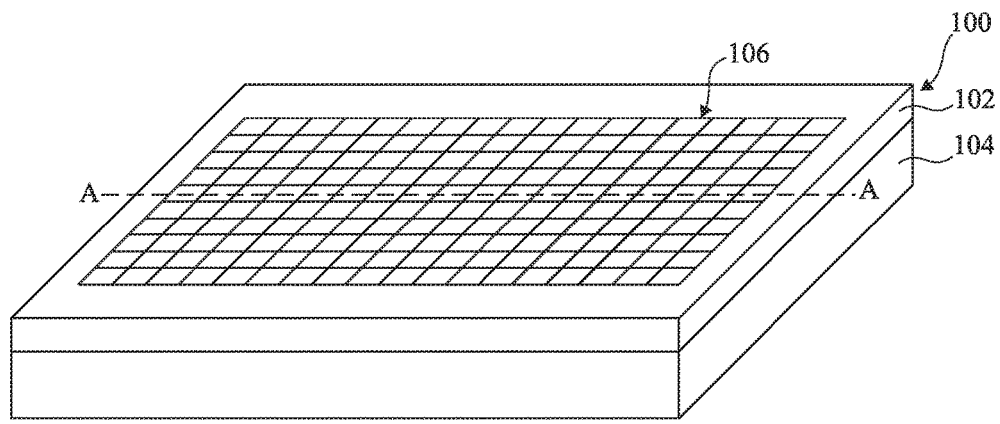
FIG. 1A is a perspective view of a 3D device comprising a 2D image sensor superposed over an IR (infrared) sensor according to an example embodiment.

FIG. 1A is a perspective view of a three dimensional (3D) imaging device 100 comprising a plurality of levels, each level corresponding to a semiconductor layer. A top level 102 comprises a two dimensional (2D) image sensor (in this example configured as a back side illuminated device), and a bottom level 104 comprises a depth sensor (in this example configured as a front side illuminated device). The depth sensor is, for example, lit (i.e., exposed to radiation) through the top level 102, and the image sensor and depth sensor are, for example, at least partially overlapping.

In the example of FIG. 1A, the 2D image sensor comprises an array 106 of 180 pixels arranged in a matrix of 10 rows and 18 columns, although in alternative embodiments many different formats would be possible. It will be understood that the total number of pixels is just an example and that the 2D image sensor may include more or less pixels as dictated by the imaging application.

The 2D image sensor is, for example, capable of capturing a color image, the device 100, for example, comprising a color filter (not illustrated in FIG. 1A) permitting each pixel to capture red, green or blue light. In alternative embodiments, the 2D image sensor could however capture a grey-scale image, or another type of 2D image.

Figure 1B:
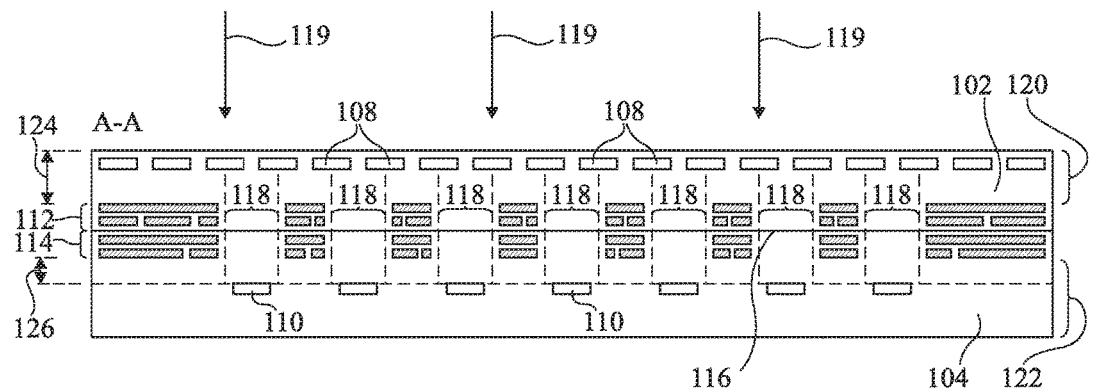
FIG. 1B is a cross-section view of the 3D device of FIG. 1A.

FIG. 1B is a cross-section view taken along a line A-A passing through a row of the pixels of the 2D image sensor array 106 and through the underlying structure. Pixels 108 of the 2D image sensor array 106 comprise photo-generation regions in which charge is generated by photons passing through the structure. As known by those skilled in the art, the photo-generation regions are, for example, formed by pinned photodiodes positioned close to the surface of the top level 102 of the device 100. Depth pixels 110 are, for example, formed in the level 104, for example at regular intervals, but with a lower density when compared with the 2D image pixels.

In some embodiments, the depth pixels are based on so-called "time-of-flight" technology, according to which a light signal is transmitted into the image scene, and the depth pixels are capable of detecting the return signal reflected back by objects in the image scene. As known by those skilled in the art, depth information is, for example, calculated by a detection circuit (not illustrated in the figures) coupled to the depth pixels and permitting the arrival time or phase of the returned light signal at each depth pixel to be determined, and thus the flight time of the light signal to be estimated. The depth pixels are, for example, sensitive to light in the near infrared (NIR) wavelength range, the light signal for example being in the NIR range.

The depth pixels 110 in the example of FIG. 1B are, for example, each formed by a fast photodiode, for example having dimensions equal to around those of the 2D image pixels. Such fast photodiodes, for example, allow the phase of the received light signal to be detected, as described in more detail in the publication by R. Lange and P. Seitz entitled "Solid-state TOF range camera", IEE J. on Quantum Electronics, vol. 37, No. 3, March 2001, the disclosure of which is hereby incorporated by reference. For example, the received light signal is a periodic signal, such as a sinewave, and the fast photodiodes permit the received light to be sampled during three of more phases of each period of the received light signal.

Alternatively, the depth pixels 110 could be formed by SPADs (single-photon avalanche diodes), or by other pixel technologies sensitive to NIR light and capable of detecting the arrival time and/or phase of the received NIR light signal.

Metal interconnection layers 112, 114 are, for example, formed in the top and bottom levels 102 and 104, respectively. Each interconnection layer 112, 114 comprises one or more metal levels. The interconnection layer 112 is, for example, positioned between the image sensor array 106 and an interface 116 between the levels 102, 104. The metal interconnection layer 114 is, for example, positioned between the depth pixels 110 forming the depth sensor and the interface 116. The levels 102 and 104 are, for example, attached together by bonding. Connections between the levels 102, 104 are, for example, formed by pads formed on the contacting surfaces of the levels 102, 104, and coupled to the respective interconnection levels by vias, as described in more detail below.

The depth pixels 110 in the level 104 are lit by (exposed to) light in the near infrared range that passes through the level 102. Thus, the infrared light also passes through the metal interconnection layers 112, 114 of the levels 102, 104. In some embodiments, the layers 112, 114 each comprise zones 118 in which no metal layers are present, or in which metal layers are present that have a reduced density with respect to the metal layers present in the rest of the layers 112, 114. A zone 118 is, for example, aligned with each depth pixel 110 in the direction of illumination of the device 100, represented by arrows 119 in FIG. 1B.

The levels 102, 104, for example, each comprise silicon substrates 120, 122 respectively, having front sides upon which the metal interconnection layers 112, 114 are formed. The zones 118 of the layers 112, 114 are, for example, filled with oxide, making them relatively transparent. Light in the visible wavelength range, for example of between 400 and 700 nm, will penetrate a relatively short distance through silicon at the back side of substrate 120. However, light in the near infrared (NIR) wavelength range, for example from around 800 to 1000 nm, will penetrate further (through the back side of substrate 120 and the layers 112, 114 to enter the front side of substrate 122), and thus reach the depth sensors 110 despite traversing the silicon substrate 120 of the level 102. Thus, the positioning of the 2D image pixels 108 and depth pixels 110 in the silicon structure of the device 100 is such that it will lead to an inherent filtering by the device, the pixels 108 receiving a broad spectrum of light, while the pixels 110 receive mostly light having longer wavelengths in the NIR range or above.

The silicon depth that the NIR light traverses to reach the depth pixels is equal to the sum of the thickness 124 of the substrate 120 and the depth 126 of the depth pixels 110 in the substrate 122. The substrates 120 and 122, and the positioning of the pixels 110, are, for example, such that the silicon depth 124+126 is for example in the range 5 to 20 µm, and in some embodiments equal to at least 10 µm.

Figure 2A:
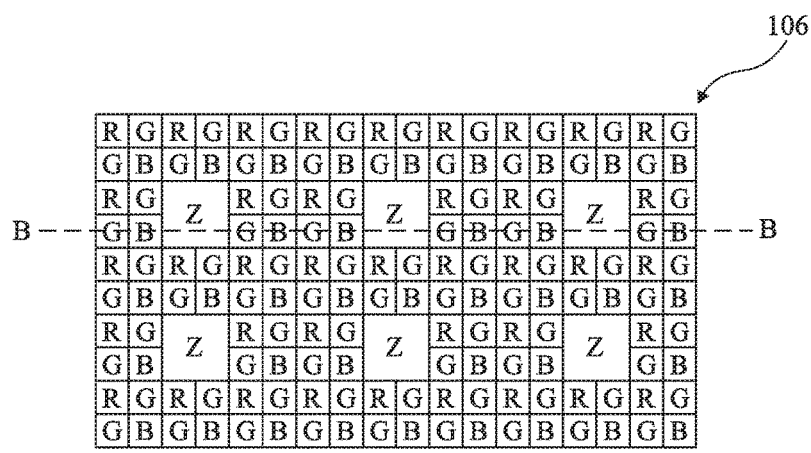
FIG. 2A is a plan view of the pixel array of the 3D device of FIG. 1A according to an example embodiment.

FIG. 2A is a plan view representing the pixel arrangement of the 2D image sensor of the device 100 according to an example embodiment in which the 2D image sensor comprises red (R), green (G) and blue (B) pixels, and certain pixels in the pixel array are replaced by depth pixels (Z). In particular, in the example of FIG. 2A, the 2D image pixels are arranged in 2-by-2 groups, each comprising a red, a blue and two green pixels, the green pixels being diagonally opposite to each other.

However, some of these 2-by-2 groups are replaced by depth pixels, which have for example four times the surface area of the 2D image pixels. In particular, the 2-by-2 groups are removed from the 2D image sensor to leave openings providing passages via which light may penetrate through layer 102 and fall on the depth pixels of the underlying array in layer 104.

The missing 2D image information resulting from these missing 2D imaging pixels can, for example, be corrected by image processing, using for example interpolation techniques based on the surrounding pixels as is well known to those skilled in the art. Furthermore, information from the depth pixels, such as the intensity of the signal received by the depth pixels, may also be used to improve this interpolation. Indeed, while the depth pixels receive light in the near infrared range, some of this infrared light will result from ambient light conditions, and can thus provide information regarding the overall light intensity at each pixel.

Similarly, the depth map generated based on the depth pixels will have missing information in view of the missing depth pixels where the 2D imaging pixels are present in the overlying array of layer 102. This missing information can, for example, be deduced by interpolation, using the information from surrounding depth pixels. Furthermore, the 2D image captured by the 2D image pixels may aid the interpolation. For example, a detection of uniform zones in the 2D image could be performed and pixels in such uniform zones can be considered to correspond to relative similar depths in the image scene. Furthermore, the information on light intensity from the 2D image pixels may be used to improve the detection by the depth sensor by providing an estimation of the ambient light levels that may skew the readings from the depth pixels. For example, this information may be used to alter the sensitivity of array of depth pixels.

Figure 2B:
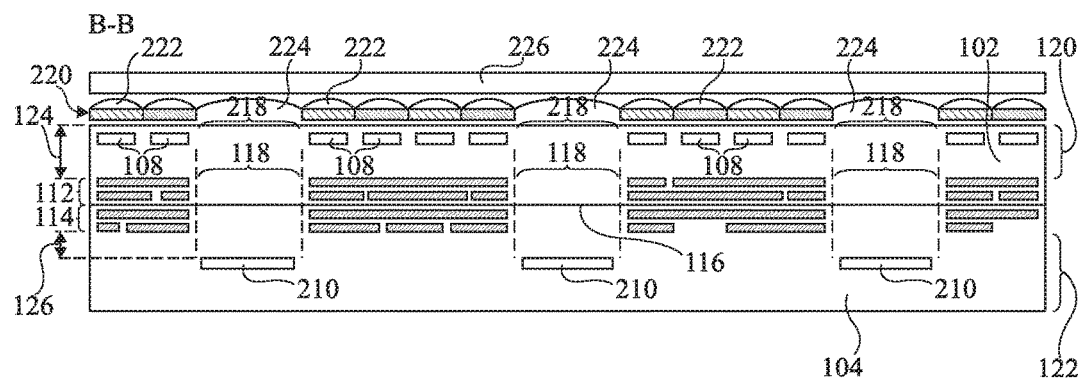
FIG. 2B is a cross-section view of the 3D device of FIG. 2A according to an example embodiment.

FIG. 2B is a cross-section view of the device of FIG. 2A taken along a line B-B running through a row of pixels including depth pixels. Certain features in the example of FIG. 2B are the same as corresponding features in FIG. 1B, and these features have been labeled with like reference numerals and will not be described again in detail.

In the example of FIG. 2B, the depth pixels 210 are larger than in the example of FIG. 2A, and the 2D pixel array has openings 218 in which no pixels 108 are present. The zones 118 of the interconnection layers 112, 114 in which there are no interconnections present are also, for example, larger than in the example of FIG. 2A, these zones, for example, having a width equal to or larger than the width of the depth pixels 210.

As with the embodiment of FIG. 1B, the combined silicon thickness 124, 126 traversed by the NIR light in the embodiment of FIG. 2B is, for example, in the range 3 to 10 µm.

Figure 3:
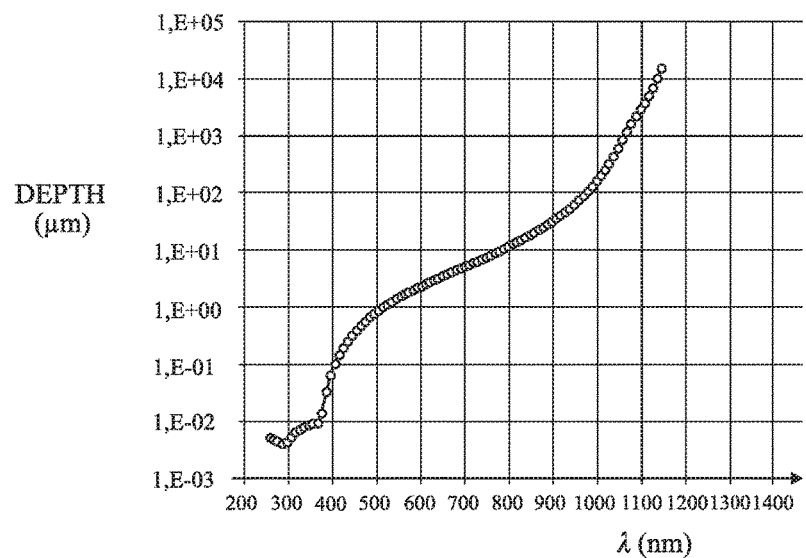
FIG. 3 is a graph illustrating light absorption in silicon.

FIG. 3 is a graph illustrating the absorption depth (DEPTH) in µm of light in silicon as a function of wavelength λ in nm, the absorption depth being defined as the depth at which 37 percent of the light is absorbed. As illustrated, a depth of around 3 µm of silicon will cause light having a wavelength up to around 650 nm to be absorbed, whereas NIR light having a wavelength for example of around 900 nm is not absorbed until a depth of more than 10 µm.

Referring again to FIG. 2B, a color filter 220 is, for example, positioned over the level 102, above the 2D image pixels 108, an individual color filter, for example, being positioned over each pixel. This filter 220 is, for example, transparent above the openings 218 where the NIR light is permitted to enter the device and reach the depth pixels 210.

In some embodiments, in addition to or instead of the color filter 220, an optical filter 226 is provided over the device, this filter, for example, being adapted to allow visible light, and NIR light at the wavelength of the light signal received by the depth pixels 210, to pass through. Light of other wavelengths is filtered out.

Figure 4:
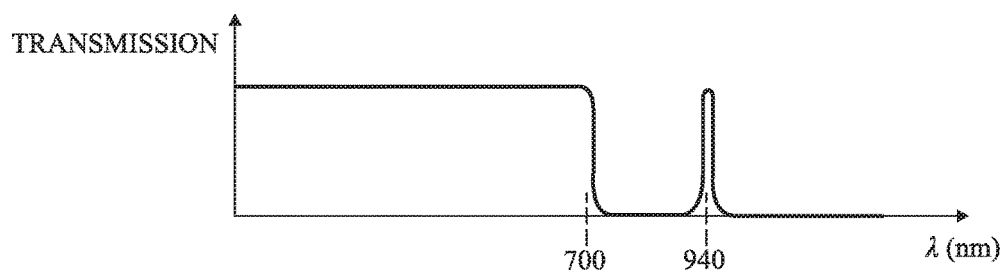
FIG. 4 is a graph representing an example of filter characteristics of an optical filter of the device of FIG. 2B according to an example embodiment.

FIG. 4 is a graph illustrating an example of the transmission (TRANSMISSION) of the optical filter 226 as a function of the wavelength λ. For example, the filter transmits light up to a wavelength of around 700 nm, and filters out light having higher wavelengths, except for light in the range of around 935 to 945 nm, the light signal in this example having a wavelength of 940 nm.

Referring again to FIG. 2B, in some embodiments, an individual lens 222 is positioned over each 2D image pixel 108, for example, the lenses 222 being formed over the corresponding individual color filter of each pixel. Each lens 222, for example, focuses light onto the pixels 108 at a depth of a few µm below the lens. Furthermore, in some embodiments, further lenses 224 are positioned over the depth pixels 210, each lens 224, for example, focusing the light onto the pixels 210 at a depth of between 10 and 30 µm below the lens.

Figure 5:
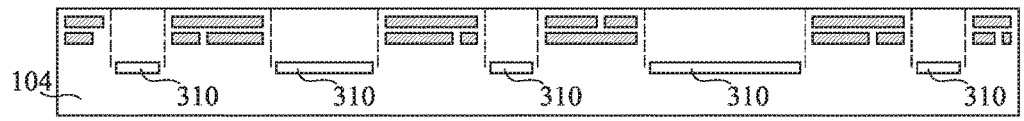
FIG. 5 is a cross-section view of an IR sensor of the 3D device of FIG. 2A according to an alternative embodiment.

FIG. 5 is a cross-section view of the level 104 according to an alternative embodiment to that of FIGS. 1B and 2B. In the example of FIG. 5, the depth pixels 310 have varying widths, and thus photo-generation regions of varying sizes. This, for example, permits the sensitivity of the detector to be varied by selectively activating pixels based on the received signal level. Additionally or alternatively, pixels having metal shields with different sized apertures could be provided such that the pixels have varying sensitivity. Such techniques for varying the sensitivity of a depth sensor are for example described in more detail in the United States Patent Application Publication No. 2016/0284743 (incorporated by reference).

A process of assembling 3D devices will now be described with reference to FIGS. 6A and 6B.

Figure 6A:
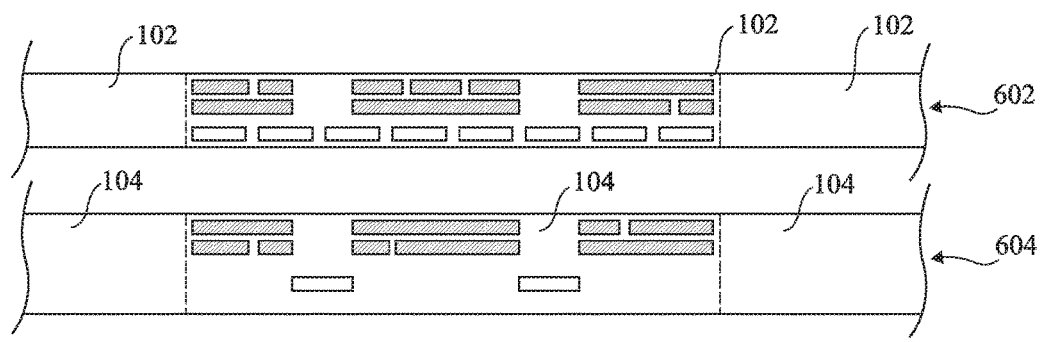
FIGS. 6A and 6B are cross-section views representing manufacturing steps of a 3D device according to an example embodiment of the present disclosure.

FIG. 6A illustrates a wafer 602 following the fabrication of multiple levels 102 of the 3D devices, and a wafer 604 following the fabrication of multiple levels 104 of the 3D devices, only one of each of the levels 102, 104 being illustrated in detail in the figure.

Figure 6B:
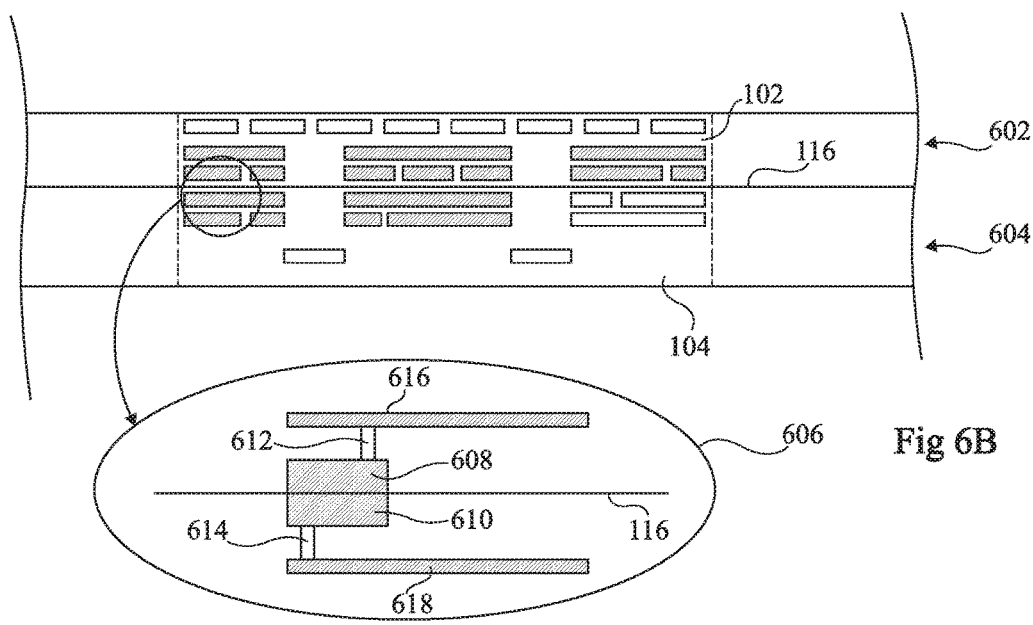

FIG. 6B illustrates the assembly step, in which the wafer 102 is, for example, turned such that the sides of the wafer 102, 104 having the interconnection layers are facing each other. These sides are then for example bonded together using molecular hybrid bonding. At the interface 116 between the wafers, electrical connections are, for example, provided. For example, as represented by a blow-up 606, a connection pad 608 of the level 102 is aligned with and contacts a connection pad 610 of the level 104. The pads 608, 610 are, for example, coupled using respective vertical vias 612, 614 to metal levels 616, 618 of the interconnection layers of each level 102, 104.

Figure 7:
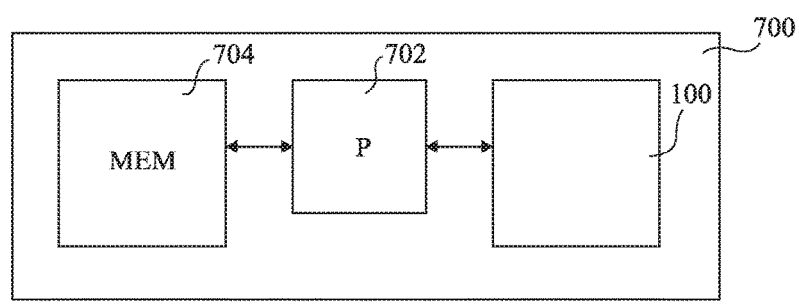
FIG. 7 schematically illustrates an image capturing device according to an example embodiment.

FIG. 7 schematically illustrates an image capturing device 700 comprising the 3D device 100 of FIG. 1. The image capturing device 700 is, for example, a portable electronics device such as a mobile telephone, laptop or tablet computer, digital camera, etc. The device 700 for example comprises a processing device (P) 702 coupled to the 3D device 100 and comprising one or more processing cores under control of software instructions stored in a memory (MEM) 704. The memory 704, or a further memory (not illustrated in FIG. 7), for example stores 2D images and depth maps captured by the device 100. The processing device 702 is, for example, configured to perform image processing on the pixel information provided by the device 100 in order to generate the 2D images and depth maps, including, for example, applying interpolation algorithms as described above with reference to FIG. 2A. Additionally or alternatively, the processing device 702 is, for example, configured to control the sensitivity of the depth sensor as described above based on 2D image information captured by the 2D image sensor. In some embodiments, some of the image processing and/or depth estimation may additionally be performed by the 3D device 100, for example, by circuits integrated in the level 104.

An advantage of the embodiments described herein is that the 3D structure of the device having a depth sensor on the bottom level provide a particularly good sensitivity for capturing NIR wavelengths, and a high rejection of visible light. Furthermore, the solution permits heterogeneous technologies and connection topologies to be used for each sensor, and integrated into a same device.

Furthermore, it is possible to integrate relatively complex readout logic for the depth pixels in the bottom level.

Having thus described at least one illustrative embodiment, various alterations, modifications and improvements will readily occur to those skilled in the art. For example, while examples have been described in which the levels 102, 104 are attached by molecular bonding, in alternative embodiments other technologies could be employed to attach the levels 102, 104.

The invention claimed is:

1. An image capturing device, comprising:
a three dimensional (3D) device, including:
a first level having a two dimensional (2D) image sensor comprising an array of first pixels; and
a second level having a depth sensor comprising a plurality of second pixels sensitive to light in a near infrared wavelength range,
wherein the plurality of second pixels of the depth sensor are lit by radiation that passes through the first level; and
a processing device coupled to the 3D device and configured to perform image processing on pixel information captured by both the 2D image sensor and the depth sensor in order to generate 2D images and depth maps;
wherein the processing device is configured to:
adjust a sensitivity of the depth sensor in response to the 2D pixel information captured by the 2D image sensor by selectively actuating certain pixels of the plurality of second pixels when sensing light in the near infrared wavelength range based on aperture size;
generate 2D images based on pixel information captured by the 2D image sensor and light intensity information captured by the second pixels of the depth sensor; and
generate the depth maps based on depth information determined based on signals provided by the second pixels of the depth sensor and on 2D pixel information captured by the 2D image sensor.

2. The image capturing device of claim 1, wherein the first level is superposed over the second level such that the 2D image sensor at least partially overlaps the depth sensor, said first level comprising:
an array of photosensitive elements forming the first pixels and arranged to be exposed to an image scene; and
a first electrical interconnection layer; and
said second level comprising:
a second electrical interconnection layer bonded to the first electrical interconnection layer; and
an array of photosensitive elements forming the second pixels.

3. The image capturing device of claim 2, wherein the first and second electrical interconnection layers are bonded together by molecular bonding.

4. The image capturing device of claim 2, wherein the first and second electrical interconnection layers have one of a reduced density of interconnections or an absence of interconnections in zones that are aligned with locations of each second pixel in a direction of illumination to receive said radiation.

5. The image capturing device of claim 2, wherein the first and second levels each comprise a silicon substrate and wherein a silicon depth between a radiation receiving surface of the silicon substrate for the first level and the second pixels in the silicon substrate of the second level is in a range of 5 to 20 μm.

* * * * *